(12) United States Patent
Xie et al.

(10) Patent No.: US 8,723,188 B2
(45) Date of Patent: May 13, 2014

(54) LIGHT EMITTING DIODE AND METHOD FOR PREPARING THE SAME

(75) Inventors: Chunlin Xie, Guangdong (CN); Xilin Su, Guangdong (CN); Hongpo Hu, Guangdong (CN); Wang Zhang, Guangdong (CN)

(73) Assignees: Shenzhen BYD Auto R&D Company Limited, Shenzhen, Guangdong (CN); BYD Company Limited, Shenzhen, Guangdong (CN)

( * ) Notice: Subject to any disclaimer, the term of this patent is extended or adjusted under 35 U.S.C. 154(b) by 0 days.

(21) Appl. No.: 13/537,773

(22) Filed: Jun. 29, 2012

(65) Prior Publication Data

US 2012/0261708 A1    Oct. 18, 2012

Related U.S. Application Data

(63) Continuation of application No. PCT/CN2010/078305, filed on Nov. 1, 2010.

(30) Foreign Application Priority Data

Dec. 30, 2009    (CN) .......................... 2009 1 0238965

(51) Int. Cl.
*H01L 27/15* (2006.01)
(52) U.S. Cl.
USPC .................... 257/79; 257/82; 257/98; 438/29

(58) Field of Classification Search
USPC .......... 257/76, 98, E33.064, 79, 82, E33.025; 438/29
See application file for complete search history.

(56) References Cited

U.S. PATENT DOCUMENTS

| | | | | |
|---|---|---|---|---|
| 7,888,687 | B2* | 2/2011 | Miki | 257/79 |
| 8,106,405 | B2* | 1/2012 | Nagawa | 257/79 |
| 8,436,965 | B2* | 5/2013 | Ishitani et al. | 349/108 |
| 2010/0081221 | A1* | 4/2010 | Lee et al. | 438/29 |
| 2010/0098127 | A1* | 4/2010 | Higuchi et al. | 372/50.11 |
| 2010/0271685 | A1* | 10/2010 | Liu | 359/265 |
| 2012/0107987 | A1* | 5/2012 | Hur et al. | 438/46 |
| 2012/0113376 | A1* | 5/2012 | Hayashi et al. | 349/141 |

* cited by examiner

*Primary Examiner* — Jarrett Stark
*Assistant Examiner* — Shahed Ahmed
(74) *Attorney, Agent, or Firm* — Finnegan, Henderson, Farabow, Garrett & Dunner, LLP

(57) ABSTRACT

A light emitting diode includes a substrate comprising a plurality of first grooves and a plurality of first convex parts formed on a surface of the substrate, with the first groove formed between two neighboring first convex parts; a semiconductor structure formed on the substrate comprising a plurality of second convex parts corresponding to the plurality of first grooves and a plurality of second grooves corresponding to the plurality of first convex parts; a transparent conductive layer formed on the semiconductor structure and configured to transmit a current to the plurality of second convex parts; a first electrode electrically connected with the semiconductor structure; and a second electrode electrically connected with the transparent conductive layer. A method for preparing the light emitting diode is also provided.

10 Claims, 5 Drawing Sheets

LIGHT EMITTING DIODE AND METHOD FOR PREPARING THE SAME

CROSS-REFERENCE TO RELATED APPLICATION

This application is a continuation of International Application No. PCT/CN2010/078305, filed Nov. 1, 2010, which claims priority to Chinese Patent Application No. 200910238965.3, filed with the State Intellectual Property Office of P. R. C. on Dec. 30, 2009, the entire contents of both of which are incorporated herein by reference.

FIELD

The present disclosure relates to the field of semiconductor, and more particularly, to a light emitting diode (LED) and a method for preparing the same.

BACKGROUND

A light emitting diode (LED) chip is a junction type electroluminescent semiconductor device that converts an electrical signal to a light signal. Using gallium nitride based LEDs as a solid light source, with the advantages of small sizes, high efficiency, long life-span, low energy consumption, and environmental friendliness, is regarded as a revolution in the illumination history, and becomes the research and industrial focus in the international semiconductor and illumination fields.

III-V group nitride materials, such as GaN, InGaN, AlGaN and AlGaInN, have a continuously adjustable direct bandwidth ranging from 0.7 eV to 6.2 eV, which covers the spectrum range from ultraviolet light to infrared light. They are suitable materials for making a blue, green or white light emitting device.

Sapphire substrates are one type of the conventional substrates for growing a GaN layer through hetero-epitaxy technology. Because there is a large mismatch of lattice constants and difference in thermal expansion coefficients between the sapphire substrate and the GaN epitaxial layer, great stress and a plurality of crystal defects may exist in the GaN epitaxial layer. And the crystal defects may become nonradiative recombination centers, which will affect the internal quantum efficiency and the performance of the LED. FIG. 1 is a cross-sectional view of a conventional LED. As shown in FIG. 1, a gallium nitride based LED may comprise: a sapphire substrate 10; a semiconductor structure 20 formed on the sapphire substrate 10 and comprising an n-type gallium nitride layer 21, a light emitting layer 22 formed on the n-type gallium nitride layer 21, and a p-type gallium nitride layer 23 formed on the light emitting layer 22; a transparent conductive layer 40 formed on the p gallium nitride layer 23; an n-type electrode 30 formed on the n-type gallium nitride layer 21; and a p-type electrode 50 formed on the transparent conductive layer 40. The n-type electrode 30 and the p-type electrode 50 may be connected with a power supply. A current may diffuse in the transparent conductive layer 40 and pass through the light emitting layer 22 in a vertical direction, and the light emitting layer 22 may generate and emit light. However, because a plurality of crystal defects may exist in the semiconductor structure 20, electrons and electron holes may recombine in the crystal defects, and energy may be released in the form of heat rather than light, forming a nonradiative recombination. If the semiconductor structure 20 is formed on a flat sapphire substrate 10, crystal defects may be even increased in the semiconductor structure 20, which may cause more nonradiative recombinations to be generated, resulting in increased heat production and decreased energy utilization rate. This will further reduce the internal quantum efficiency and the performance of the LED.

SUMMARY

A light emitting diode (LED) with high internal quantum efficiency and a method for preparing the LED are provided.

According to an aspect of the present disclosure, a light emitting diode may be provided. The light emitting diode may comprise:

a substrate comprising a plurality of first grooves and a plurality of first convex parts formed on a surface of the substrate, with the first groove formed between two neighboring first convex parts;

a semiconductor structure formed on the surface of the substrate, said semiconductor structure comprising a plurality of second convex parts corresponding to the plurality of first grooves and a plurality of second grooves corresponding to the plurality of first convex parts;

a transparent conductive layer formed on the semiconductor structure and configured to transmit a current to the plurality of second convex parts;

a first electrode electrically connected with the semiconductor structure; and a second electrode electrically connected with the transparent conductive layer.

According to another aspect of the present disclosure, a method for preparing a light emitting diode may be provided. The method may comprise:

a) providing a substrate;

b) etching the substrate to form a plurality of first grooves and a plurality of first convex parts on a surface of the substrate, with the first groove formed between two neighboring first convex parts;

c) forming a semiconductor structure on the surface of the substrate, which comprises a plurality of second convex parts corresponding to the plurality of first grooves and a plurality of second grooves corresponding to the plurality of first convex parts;

d) forming a transparent conductive layer on the semiconductor structure, which is configured to transmit a current to the plurality of second convex parts; and e) forming a first electrode electrically connected with the semiconductor structure and a second electrode electrically connected with the transparent conductive layer.

In some embodiments of the present disclosure, the semiconductor structure may include a plurality of second convex parts and a plurality of second grooves, and each of the comb teeth may be formed right above each first groove. When a current passes through the semiconductor structure, most of the current may pass through the plurality of second convex parts which have less crystal defects, and only a small portion of the current may pass through the plurality of second grooves which have more crystal defects. Therefore, the probability of nonradiative recombinations may be decreased, thus increasing the internal quantum efficiency, i.e. the light emitting efficiency, of the LED.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

The above and other features and advantages of the disclosure will be better understood from the following detailed descriptions taken in conjunction with the accompanying drawings, in which.

DETAILED DESCRIPTION OF THE EMBODIMENTS

Reference will be made in detail to embodiments of the present disclosure. The embodiments described herein with reference to drawings are explanatory, illustrative, and used to generally understand the present disclosure. The embodiments shall not be construed to limit the present disclosure.

The present disclosure relates generally to the field of light emitting diode. It should be understood that the following disclosure provides different embodiments, or examples, for implementing different features of the disclosure. Specific examples of components and arrangements are described below to simplify the present disclosure. These are, of course, merely illustrative and are not intended to limit the present disclosure. In addition, the present disclosure may repeatedly refer to numerals and/or letters in the various examples. This repetition is for the purpose of simplicity and clarity and does not in itself denote a relationship between the various embodiments and/or configurations under discussion. Moreover, the formation of a first feature over or on a second feature described below may include embodiments in which the first and second features are in direct contact, and may also include embodiments in which additional features may be formed interposing the first and second features, such that the first and second features may not be in direct contact.

In some embodiments of the present disclosure, a LED may comprise:

a substrate comprising a plurality of first grooves and a plurality of first convex parts formed on a surface of the substrate with the first groove formed between two neighboring first convex parts;

a semiconductor structure formed on the substrate comprising a plurality of second convex parts corresponding to the plurality of first grooves and a plurality of second grooves corresponding to the plurality of first convex parts;

a transparent conductive layer formed on the semiconductor structure and configured to transmit a current to the plurality of second convex parts;

a first electrode electrically connected with the semiconductor structure; and a second electrode electrically connected with the transparent conductive layer.

In some embodiments, the first electrode and the second electrode may be connected with a power supply. In some embodiments, the semiconductor structure may comprise a first type semiconductor layer, a light emitting layer and a second type semiconductor layer. In some embodiments, the first type semiconductor layer may include a p-type semiconductor layer, and the second type semiconductor layer may include an n-type semiconductor layer. In some embodiments, the first type semiconductor layer may include an n-type semiconductor layer, and the second type semiconductor layer may include a p-type semiconductor layer.

Figure 1:
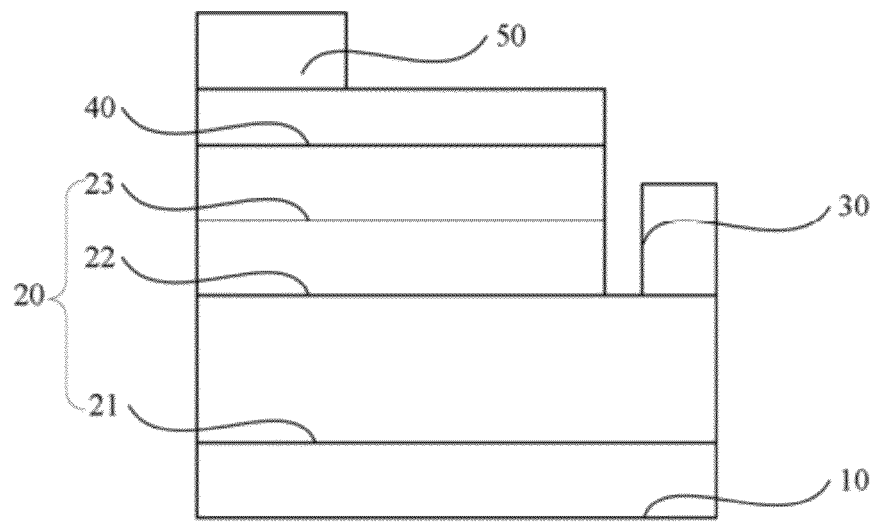
FIG. 1 is a cross-sectional view of a conventional LED.
Figure 2A:
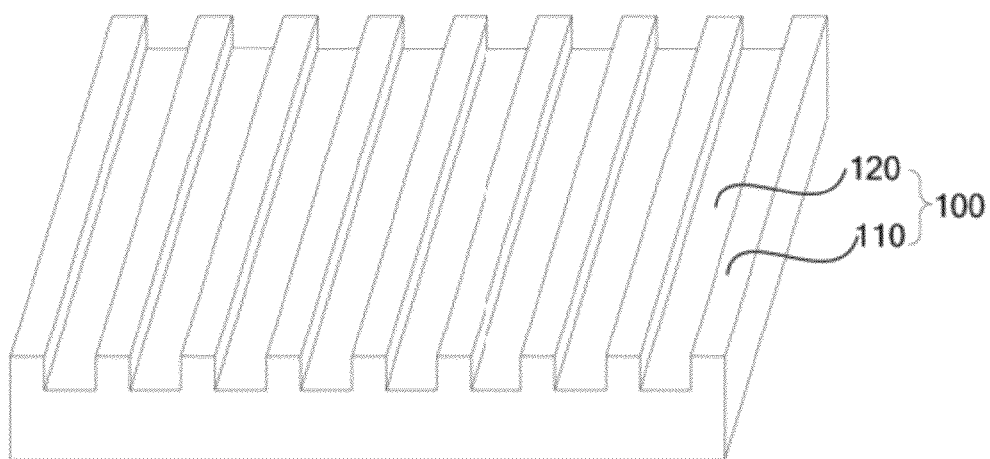
FIG. 2A is a perspective view of a substrate in an embodiment of the present disclosure.

In some embodiments as shown in FIG. 2A, the substrate 100 may be formed from a material chosen from, for example but not limited to, sapphire, silicon, SiC and ZnO. In some embodiments of the present disclosure, the substrate 100 may be formed from sapphire. In some embodiments, the substrate 100 may have a square or rectangular shape. In some embodiments, the substrate 100 may have an average thickness ranging from about 70 μm to about 150 μm. In some embodiments, the substrate 100 may comprise a plurality of first grooves 120 and a plurality of first convex parts 110 formed on a surface of the substrate 100 and arranged in an alternating matter. In some embodiments of the present disclosure, the shapes of the first grooves 120 may be substantially identical. In some embodiments, the shapes of the first convex parts 110 may be substantially identical. In some embodiments of the present disclosure, the first grooves 120 may be arranged in parallel with each other. In some embodiments, the first groove 120 may have a smooth bottom surface. In some embodiments, the first convex part 110 may have a column shape. In some embodiments, the first convex part 110 may have a smooth top surface.

Figure 2B:
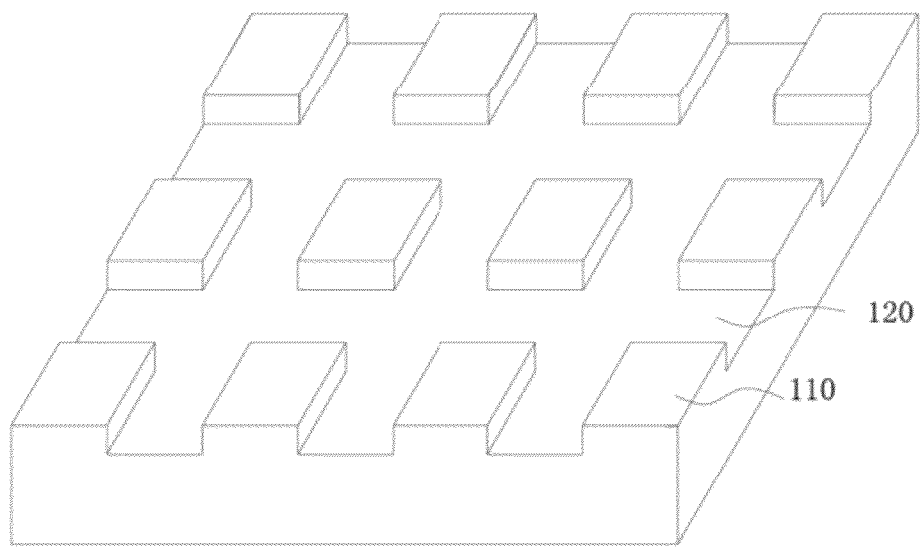
FIG. 2B is a schematic structural view of a substrate in another embodiment of the present disclosure.

In some embodiments as shown in FIG. 2B, the first grooves 120 may include two groups of parallel grooves, and these two groups may perpendicularly intersect each other. In some embodiments, the first groove 120 may have a smooth bottom surface. In some embodiments, the first convex part 110 may have a column shape. In some embodiments, the first convex part 110 may have a smooth top surface. In some embodiments of the present disclosure, the first convex part 110 may have an arc top surface. In some embodiments of the present disclosure, the first convex part 110 may have a circular cross section. In some embodiments, the first convex part 110 may have a polygonal cross section, such as a hexagonal or quadrangular cross section. In some embodiments of the present disclosure, the first convex part 110 may have a rectangular cross section, which may simplify the preparing process. In some embodiments of the present disclosure, the first groove 120 may have a width ranging from about 2 μm to about 8 μm. In some embodiments, the first groove 120 may have a width of about 6 μm. In some embodiments, the first groove 120 may have a depth ranging from about 1.5 μm to about 5 μm. In some embodiments, the first groove 120 may have a depth of about 3 μm. In some embodiments, the first convex part 110 may have a width ranging from about 2 μm to about 10 μm. In some embodiments, and the first convex part 110 have a width of about 3 μm. The width of the first groove 120 mentioned above refers to the width of the cross section of the bottom surface of the first groove. The width of the first convex part mentioned above refers to the cross section width of the figure generated by orthogonally projecting the first convex part 110 to the plane of the bottom surfaces of the first grooves 120. The crystal defects in the semiconductor structure may be reduced by selecting the above parameters. In addition, because most of the current may pass though the plurality of second convex parts 1 which correspond to the plurality of first grooves 120, the plurality of second convex parts 1 may function to emit light. Therefore, the utilization rate of the semiconductor structure may also be increased by selecting the above parameters.

Figure 3:
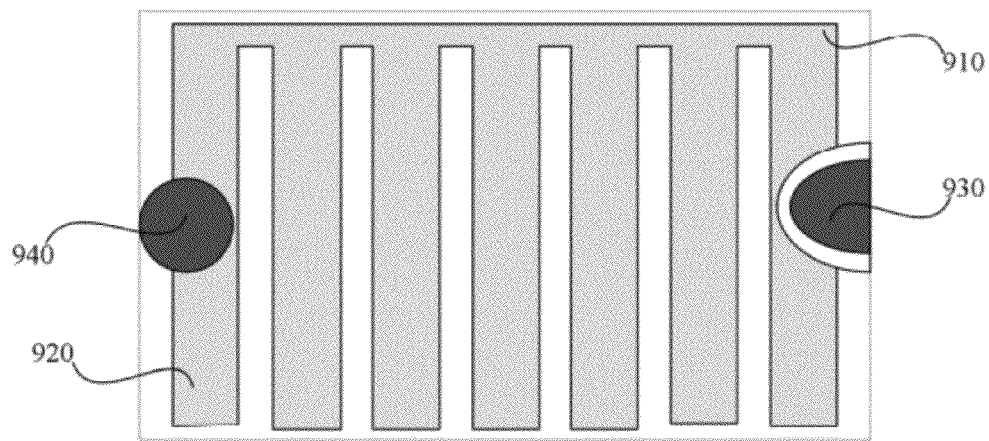
FIG. 3 is a top view of a LED in an embodiment of the present disclosure.

In some embodiments as shown in FIG. 3, the transparent conductive layer may have a comb shape. In some embodiments, the transparent conductive layer may comprise a plurality of comb teeth 920, each of which may be formed right above one first groove, and a conductive comb frame 910 connected with the plurality of comb teeth 920. In some embodiments of the present disclosure, the conductive comb frame 910 may be formed in the middle of the comb teeth 920. In some embodiments, the conductive comb frame 910 may be formed on a side of the LED, for example, an upper side or a lower side of the top view of the LED as shown in FIG. 3. When the conductive comb frame 910 is formed in the middle of the comb teeth 920, the uniformity of the current may be increased. When the conductive comb frame 910 is formed on a side of the LED, the width of the conductive comb frame 910 may be reduced and the preparing process may be simplified. Because the transverse current flow may be limited in the semiconductor structure, the current may generally flows vertically in the part of the semiconductor structure right below the transparent conductive layer, and little current may pass through the part of the semiconductor structure uncovered by the transparent conductive layer. The route of the current flow in the semiconductor structure may therefore be controlled by the design of the transparent conductive layer with the structure mentioned above to achieve a selective flow of the current.

In some embodiments of the present disclosure, the first electrode may be an n-type electrode and the second electrode may be a p-type electrode. In some embodiments as shown in FIG. 3, the first electrode 930 may have a square top surface and the second electrode 940 may have a circular top surface. In some embodiments, the LED may be connected with a power supply via the first electrode 930 and the second electrode 940. In some embodiments, the first electrode 930 and the second electrode 940 may comprise a Ti/Au alloy. In some embodiments of the present disclosure, the first electrode 930 and the second electrode 940 may comprise an alloy comprising at least one metal chosen from Ni, Au, Al, Ti, Pd, Pt, Sn and Cr. In some embodiments of the present disclosure, the first electrode 930 and the second electrode 940 may have a thickness ranging from about 0.2 µm to about 1 µm. In some embodiments of the present disclosure, the first electrode 930 and the second electrode 940 may have a thickness of about 0.5 µm. The current may be transmitted from the second electrode 940 to the transparent conductive layer 900, and distributed uniformly in the comb teeth 920 and the conductive comb frame 910. Because the scope of the current flow in the semiconductor structure may be determined by the width of the comb teeth 920, in some embodiments of the present disclosure, the width of the comb teeth 920 may be equal to or less than the width of the second convex parts of the semiconductor structure, thereby allowing the current to be transmitted in the second convex parts of the semiconductor structure and improving the internal quantum efficiency. In some embodiments of the present disclosure, the transparent conductive layer may have an average thickness ranging from about 1 nm to about 1000 nm, thereby facilitating light emission of the LED.

Figure 4:
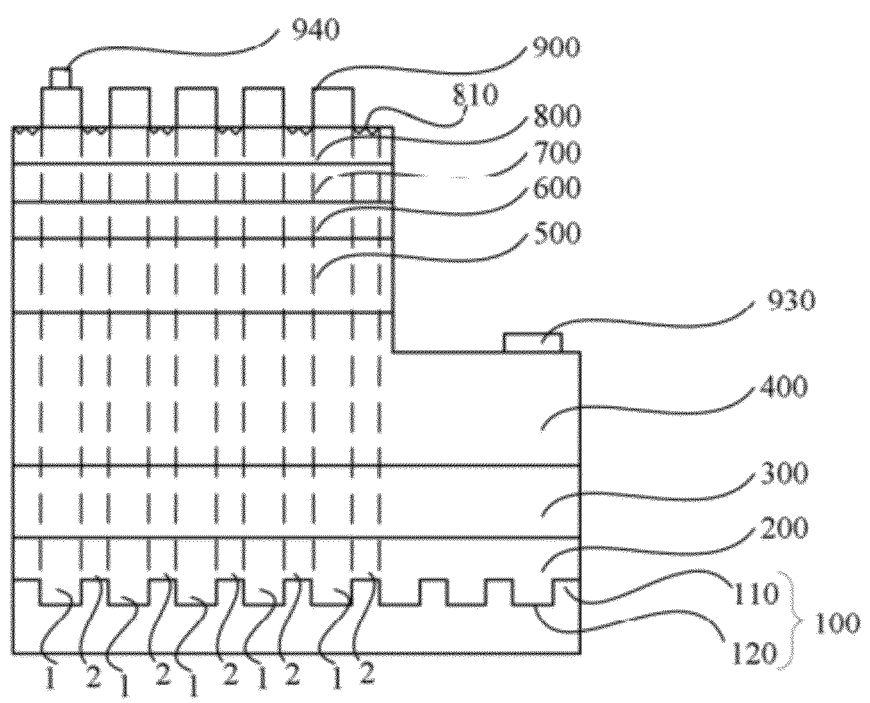
FIG. 4 is a cross-sectional view of a LED in an embodiment of the present disclosure.

In some embodiments as shown in FIG. 4, the LED described herein may comprise: the substrate 100 mentioned above; a semiconductor structure; and the comb like transparent conductive layer 900 mentioned above. In some embodiments, the semiconductor structure may comprise:

a nucleation layer 200 formed on the substrate 100;

a buffer layer 300 formed on the nucleation layer 200;

a first semiconductor layer 400 formed on the nucleation layer 300;

a light emitting layer 500 formed on the first semiconductor layer 400;

a second semiconductor barrier layer 600 formed on the light emitting layer 500; and a second semiconductor layer.

In some embodiments, the first semiconductor layer 400 may comprise an n-type semiconductor layer. In some embodiments, the LED may further comprise a first electrode 930 and a second electrode 940. In some embodiments, the first electrode 930 may be an n-type electrode, and the second electrode 940 may be a p-type electrode. In some embodiments of the present disclosure, the LED may not comprise the nucleation layer 200 and the buffer layer 300, and the first semiconductor layer 400 may be formed on the substrate 100. In some embodiments of the present disclosure, the second semiconductor layer may comprise a Mg doped p-type semiconductor layer 700 and a heavily doped p-type semiconductor layer 800. In some embodiments of the present disclosure, a part of the first semiconductor layer 400 may be uncovered by the light emitting layer 500, and the first electrode 930 may be formed on the uncovered part of the first semiconductor layer 400. In some embodiments, the p-type second electrode 940 may be formed on the comb like transparent conductive layer 900.

The substrate 100 may comprise a plurality of first grooves 120 and a plurality of first convex parts 110 formed on a surface of the substrate 100. The semiconductor structure may comprise a plurality of second convex parts 1 corresponding to the plurality of first grooves 120 and a plurality of second grooves 2 corresponding to the plurality of first convex parts 110. The crystal defects in the plurality of second convex parts 1 corresponding to the first grooves 120 may change their extending direction, so that the crystal defects may not extend through the light emitting layer. The crystal defects in the plurality of second grooves 2 corresponding to the plurality of first convex parts 110 may not change the extending direction, so that the crystal defects may extend through the light emitting layer. Therefore, the crystal defects in the plurality of second convex parts 1 may be less than those in the plurality of second grooves 2. Furthermore, each comb teeth 920 may be formed right above each first groove 120, so that most of the current may pass through the part of the semiconductor structure containing less crystal defects and only a small portion of the current may pass through the other part of the semiconductor structure containing more crystal defects. Therefore, the probability of the nonradioactive recombination may be reduced, thus improving the internal quantum efficiency of the LED and improving the energy conversion rate, i.e., the electric energy utilization rate.

Light emitting efficiency includes internal quantum efficiency and external quantum efficiency. The external quantum efficiency means the efficiency of the effective light in the light emitted by the LED. In some embodiments of the present disclosure, only a part of the second semiconductor layer may be covered by the transparent conductive layer 900 to increase the light emission, so that the external quantum efficiency of the LED may be increased. In order to further increase the external quantum efficiency of the LED, in some embodiments of the present disclosure, the part of the second semiconductor layer uncovered by the transparent conductive layer may comprise a plurality of rough structures 810. In some embodiments, the rough structures 810 may include V-shaped structures, spherical bulges or irregularly-shaped bulges. The rough structures 810 may increase the refraction of the light and reduce the total reflection of the light, which may further increase the external quantum efficiency of the LED.

In some embodiments, the semiconductor structure may include III-V group nitride materials chosen from, for example, GaN, InGaN, AlGaN and AlGaInN. In some embodiments, the first semiconductor layer 400 may include an n-type GaN layer. In some embodiments, the second semiconductor barrier layer 600 may include a p-type AlGaN layer. In some embodiments, the Mg doped p-type semiconductor layer 700 may include a p-type GaN layer doped with Mg. In some embodiments, the heavily doped semiconductor layer 800 may include a heavily doped p-type GaN layer.

In some embodiments, the light emitting layer 500 may be a multi-quantum well light emitting layer, formed on the first semiconductor layer 400. In some embodiments of the present disclosure, the quantum well structure may include an $In_xGa_{1-x}N/GaN$ (0<x<1) quantum well structure. In some embodiments of the present disclosure, the quantum well structure may include at least one structure chosen from a $In_xGa_{1-x}N/Al_yGa_{1-y}N$ (0<x<1, 0<y<1) quantum well structure, $Al_xGa_yIn_{1-x-y}N/GaN$ (0<x<1, 0<y<1, x+y<1) quantum well structure, and $Al_xGa_yIn_{1-x-y}N/Al_zGa_{1-z}N$ (0<x<1, 0<y<1, x+y<1, z<1) quantum well structure. In some embodiments, the multi-quantum light emitting layer 500 may comprise 1-10 cycles of quantum well layers, thereby improving the internal quantum efficiency. In some embodiments, the quantum well layer may comprise a potential well layer with a thickness ranging from about 2 nm to about 3 nm and a potential barrier layer with a thickness ranging from about 8 nm to about 15 nm. Electron holes and electrons may recombine in the multi-quantum light emitting layer 400 to generate photons, thus converting the electric energy into light energy and emitting light.

Figure 5:
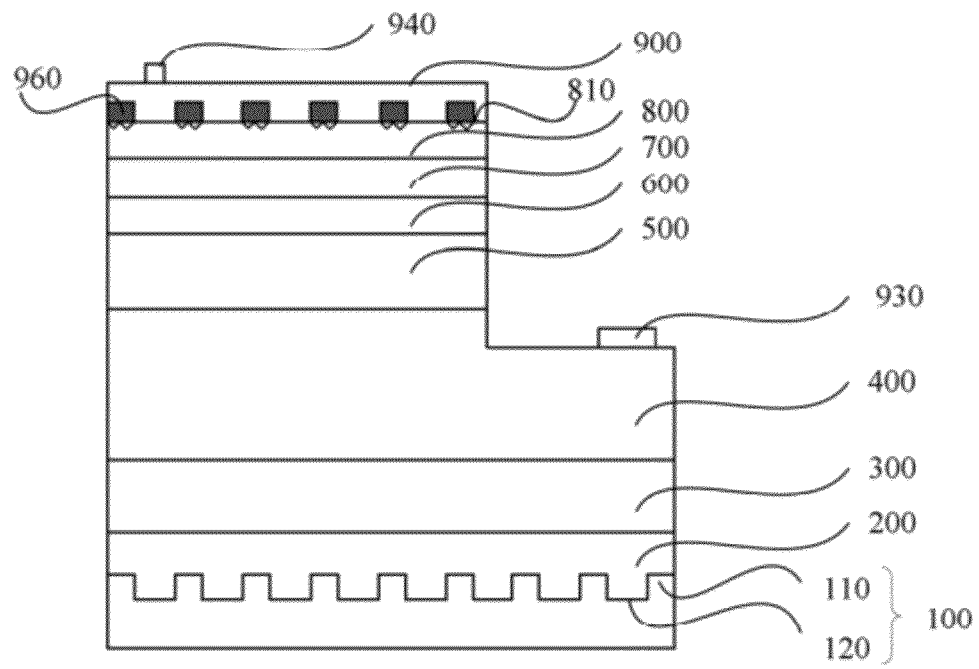
FIG. 5 is a cross-sectional view of a LED in an embodiment of the present disclosure.

In some embodiments as shown in FIG. 5, the transparent conductive layer 900 may completely cover the heavily doped p-type semiconductor layer 800. The LED may further comprise a plurality of insulator parts 960 below the transparent conductive layer 900, and each insulator part 960 may be formed right above one first convex part 110 and covers one rough structure 810. When the current passes through the semiconductor structure, most of the current may pass through the part of the semiconductor structure right above the first grooves 120 but not the other part of the semiconductor structure because of the existence of the insulator parts 960. Therefore, the probability of the nonradioactive recombination may be reduced greatly. In some embodiments of the present disclosure, the insulator parts 960 may comprise silica or silicon nitride, so that the preparing process may be simplified and light emission may not be seriously inhibited.

Figure 6:
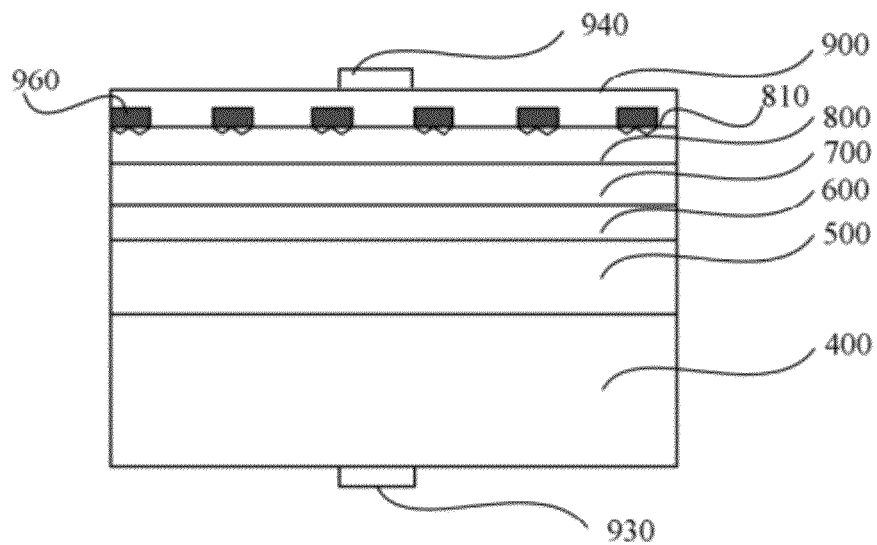
FIG. 6 is a cross-sectional view of a LED in an embodiment of the present disclosure.

In some embodiments as shown in FIG. 6, the LED may comprise:
- a first semiconductor layer 400;
- a light emitting layer 500 formed on the first semiconductor layer 400;
- a second semiconductor barrier layer 600 formed on the light emitting layer 500;
- a second semiconductor layer; and
- a transparent conductive layer 900.

The LED may further comprise a first electrode 930 formed below the light emitting layer 400 and a second electrode 940 formed on the transparent conductive layer 900. In some embodiments, the first semiconductor layer 400 may include an n-type semiconductor layer. In some embodiments, the second semiconductor layer may comprise an Mg doped p-type semiconductor layer 700 and a heavily doped p-type semiconductor layer 800. In some embodiments of the present disclosure, the heavily doped p-type semiconductor layer 800 may comprise a plurality of rough structures 810. In some embodiments, the rough structures 810 may include V-shaped structures, spherical bulges or irregularly-shaped bulges. In the embodiments as shown in FIG. 6, the transparent conductive layer 900 may completely cover the heavily doped p-type semiconductor layer 800. The LED may further comprise a plurality of insulator parts 960 below the transparent conductive layer 900, and each insulator part may be formed right above one first convex part 110 and covers one rough structure 810. When the current passes through the semiconductor structure, most of the current may pass through the part of the semiconductor structure right above the first grooves 120 but not the other part of the semiconductor structure because of the existence of the insulator parts 810. Therefore, the probability of the nonradioactive recombination may be largely decreased. In some embodiments of the present disclosure, the insulator parts 810 may comprise silica or silicon nitride, so that the preparing process may be simple and light emission may not be seriously inhibited.

Figure 7:
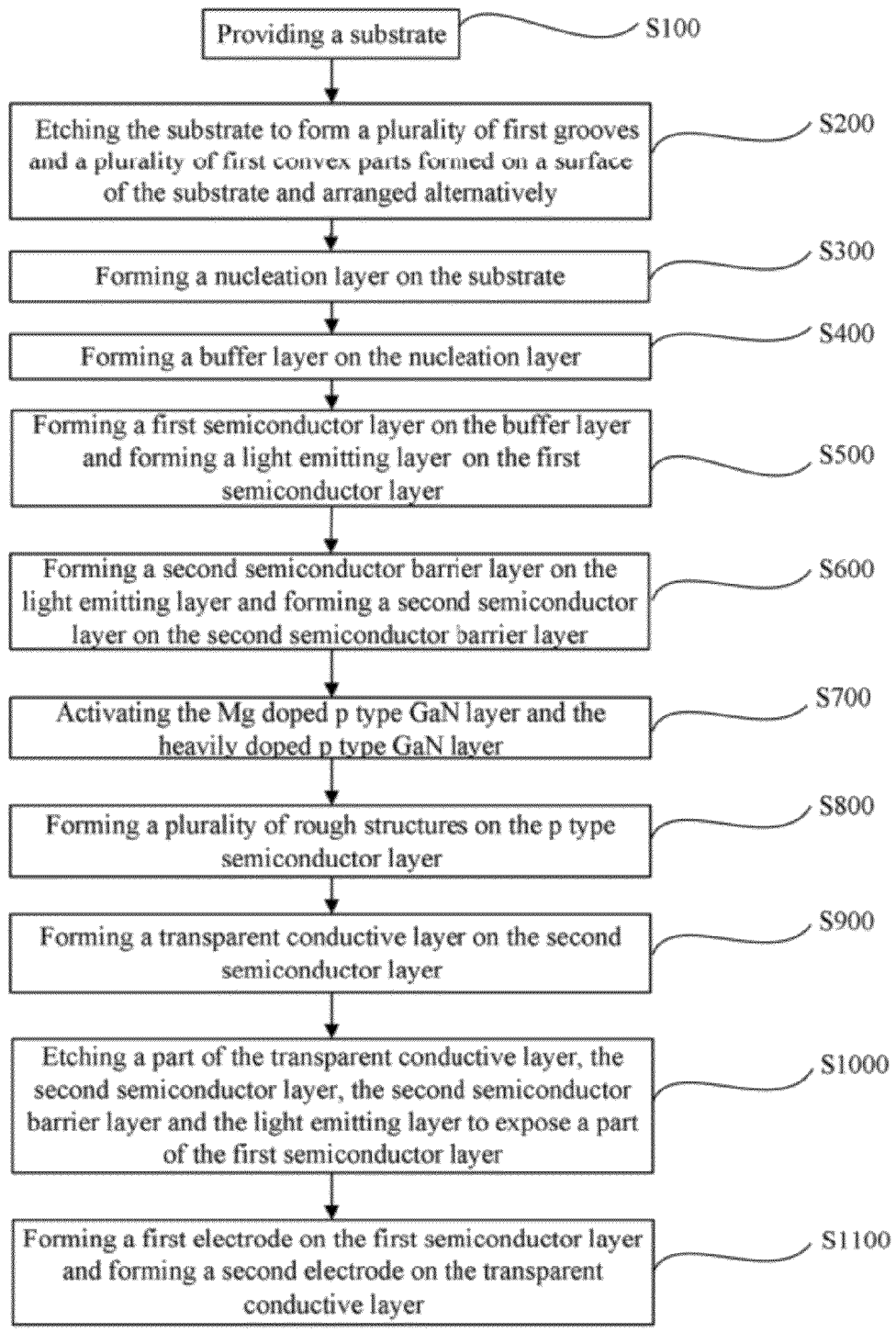
FIG. 7 is a flow chart for preparing a LED in an embodiment of the present disclosure.

A method for preparing the LED described above is also provided herein. In some embodiments as shown in FIG. 7, the method for preparing the LED may comprise the steps described hereinafter.

Step S100: a substrate 100 may be provided. In some embodiments of the present disclosure, the substrate 100 may be formed from a material chosen from, for example but not limited to, sapphire, silicon, SiC and ZnO. In some embodiments of the present disclosure, the substrate 100 may have an average thickness ranging from about 70 μm to about 150 μm. In some embodiments, the substrate 100 may be formed from sapphire. In some embodiments, the substrate may have an average thickness of about 100 μm.

Step S200: the substrate 100 may be etched to form a plurality of first grooves 120 and a plurality of first convex parts 110 on a surface of the substrate with the first groove 120 formed between two neighboring first convex parts 110. In some embodiments of the present disclosure, the shape of the first grooves 120 may be substantially-identical and the shape of the first convex parts 110 may be substantially identical. In some embodiments of the present disclosure, the first grooves 120 may be arranged in parallel with each other. In some embodiments, the first grooves 120 may have a smooth bottom surface. In some embodiments, the first convex parts 110 may have a column shape. In some embodiments, the first convex parts 120 may have a smooth top surface. As shown in FIG. 2B, in some embodiments of the present disclosure, the first grooves 120 may include two groups of parallel grooves, and these two groups may perpendicularly intersect each other. In some embodiments, the first groove 120 may have a smooth bottom surface. In some embodiments, the first convex parts 110 may have a column shape. In some embodiments, the first convex parts 110 may have a smooth top surface. In some embodiments of the present disclosure, the first convex parts 110 may have an arc top surface. In some embodiments of the present disclosure, the first convex part 110 may have a circular cross section. In some embodiments, the first convex part 110 may have a polygonal cross section, such as a hexagonal or quadrangular cross section. In some embodiments of the present disclosure, the first convex part 110 may have a rectangular cross section, which may simplify the preparing process. In some embodiments of the present disclosure, the first grooves 120 may have a width ranging from about 2 μm to about 8 μm. In some embodiments, the first grooves 120 may have a width of about 6 μm. In some embodiments, the first grooves 120 may have a depth ranging from about 1.5 μm to about 5 μm. In some embodiments, the first grooves 120 may have a depth of about 3 μm. In some embodiments, the first convex parts 110 may have a width of about 2-10 μm. In some embodiments of the present disclosure, the first convex parts 110 may have a width of about 3 μm. The width of the first grooves 120 mentioned above refers to the width of the cross section of the bottom surface of the first grooves 120. The width of the first convex parts 110 mentioned above refers to the cross section width of the figure generated by orthogonally projecting the first convex parts 110 to the plane of the bottom surfaces of the first grooves 120. The crystal defects in the semiconductor structure may be reduced by selecting the above parameters.

After Step S200, a semiconductor structure may be formed on the substrate. The semiconductor structure may comprise a nucleation layer 200; a buffer layer 300 formed on the nucleation layer 200; a first semiconductor layer 400 formed on the buffer layer 300; a light emitting layer 500 formed on the first semiconductor layer 400; a second semiconductor barrier layer 600 formed on the light emitting layer 500; and a second semiconductor layer formed on the second semiconductor barrier layer 600. The steps for preparing the semiconductor structure are described hereinafter.

Step S300: a nucleation layer 200 may be formed on the substrate 100 at a low temperature in a range from about 500° C. to about 600° C. by metal organic chemical vapor deposition technology, to improve the crystal structures of the subsequent layers. The nucleation layer 200 may include a plurality of second convex parts 1 corresponding to the plurality of first grooves 120 and a plurality of second grooves 2 corresponding to the plurality of first convex parts 110.

Step S400: a buffer layer 300 may be transversely formed on the nucleation layer 200 at a high temperature in a range from about 950° C. to about 1150° C. though epitaxial technology. In some embodiments, the buffer layer 300 may include an intrinsic GaN layer. The transversely epitaxial growth of GaN above the plurality of first grooves 120 of the substrate 110 may be achieved by controlling the temperature, pressure, ratio of the nitride to the gallium source, or other parameters. The purpose of forming the buffer layer 300 at a high temperature in a range from about 950° C. to about 1150° C. includes to alleviate the lattice constant mismatch between the above-mentioned semiconductor structure and the substrate 100, thereby facilitating the formation of the above-mentioned semiconductor structure with a better lattice structure. The above-mentioned semiconductor structure may comprise all the layers between the transparent conductive layer 900 and the substrate 100. In some embodiments, the semiconductor structure may comprise a plurality of second convex parts 1 right above the plurality of first grooves 120 and a plurality of second grooves 2 right above the plurality of first convex parts 110 in a transverse direction. In some embodiments, the buffer layer 300 may comprise III-V group nitride materials chosen from, for example, GaN, InGaN, AlGaN and AlGaInN.

Step S500: a first semiconductor layer 400 may be formed on the buffer layer 300 and a light emitting layer 500 may be formed on the first semiconductor layer 400 by metal organic chemical vapor deposition technology. In some embodiments, the first semiconductor layer 400 may include an n-type semiconductor layer and the light emitting layer 500 may include a multi-quantum well layer. In some embodiments of the present disclosure, the quantum well structure may include an $In_xGa_{1-x}N/GaN$ ($0<x<1$) quantum well structure. In some embodiments of the present disclosure, the quantum well structure may include at least one structure chosen from an $In_xGa_{1-x}N/Al_yGa_{1-y}N$ ($0<x<1$, $0<y<1$) quantum well structure, $Al_xGa_yIn_{1-x-y}N/GaN$ ($0<x<1$, $0<y<1$, $x+y<1$) quantum well structure, and $Al_xGa_yIn_{1-x-y}N/Al_zGa_{1-z}N$ ($0<x<1$, $0<y<1$, $x+y<1$, $z<1$) quantum well structure. In some embodiments, the multi-quantum light emitting layer 500 may comprise 1-10 cycles of quantum well layers, thereby improving the internal quantum efficiency. In some embodiments, the quantum well layer may comprise a potential well layer with a thickness ranging from about 2 nm to about 3 nm and a potential barrier layer with a thickness ranging from about 8 nm to about 15 nm. Electron holes and electrons may recombine in the multi-quantum light emitting layer 500 to generate photons, thereby converting the electric energy into light energy to achieve light emission of the LED.

Step S600: a second semiconductor barrier layer 600 may be formed on the light emitting layer 500 and a second semiconductor layer may be formed on the second semiconductor barrier layer 600. In some embodiments, the second semiconductor layer may comprise an Mg doped p-type semiconductor layer 700 and a heavily doped p-type semiconductor layer 800. In some embodiments of the present disclosure, the second semiconductor barrier layer 600 may include a p-type GaN layer, the Mg doped p-type semiconductor layer 700 may include a p-type GaN layer doped with Mg and the heavily doped semiconductor layer 800 may include a heavily doped p-type GaN layer, thereby reducing the contact resistance between the heavily doped p-type semiconductor layer 800 and the transparent conductive layer 900.

The semiconductor structure may be formed on the substrate 100 comprising the plurality of first grooves 120 and the plurality of first convex parts 100 formed on the surface of the substrate, thereby reducing the crystal defects in the semiconductor structure, especially reducing the crystal defects in the plurality of second convex parts 1.

Step S700: the Mg doped p-type semiconductor layer 700 and the heavily doped p-type semiconductor layer 800 may be activated by quick thermal annealing technology or ion beam bombardment technology at a temperature ranging from about 600° C. to about 800° C. under vacuum or nitrogen.

Step S800: a plurality of rough structures 810 may be formed on the heavily doped p-type semiconductor layer 800 by a roughening treatment. The roughening treatment may include a conventional treatment, such as a laser treatment or an etching treatment. The rough structures 810 may include V-shaped structures, spherical bulges or irregularly-shaped bulges.

Step S900: a transparent conductive layer 900 may be formed on the second semiconductor layer through a mask by evaporation technology. In some embodiments, the mask may have a comb shape. After Step S900, the mask, which is formed from a silicon nitride film or a silica film and formed right above the plurality of first convex parts 110, may be removed. In some embodiments of the present disclosure, the transparent conductive layer 900 may have a comb shape. The transparent conductive layer 900 may comprise a plurality of comb teeth 920, each of which may be formed right above one first groove 120, and a conductive comb frame 910 connected with the plurality of comb teeth 920. In some embodiments of the present disclosure, the conductive comb frame 910 may be formed in the middle of the comb teeth 920 or on a side of the LED, for example, an upper side or a lower side of the top view of the LED as shown in FIG. 3. When the conductive comb frame 910 is formed in the middle of the comb teeth 920, the uniformity of the current may be increased. When the conductive comb frame 910 is formed on a side of the LED, the width of the conductive comb frame 910 may be reduced and the preparing process may be simplified. Because the transverse current flow may be limited in the semiconductor structure, the current may generally flows vertically in the part of the semiconductor structure right under the transparent conductive layer, and little current may pass through the part of the semiconductor structure uncovered by the transparent conductive layer. The route of the current flow in the semiconductor structure may be controlled by the design of the transparent conductive layer with the structure mentioned above to achieve a selective flow of the current. The current may be transmitted from the second electrode 940 to the transparent conductive layer 900, and distributed uniformly in the comb teeth 920 and the conductive comb frame 910. Because the scope of the current flow in the semiconductor structure may be determined by the width of the comb teeth 920, in some embodiments of the present disclosure, the width of the comb teeth 920 may be equal to or less than that of the second convex parts of the semiconductor structure, thereby allowing the current to be transmitted in the second convex parts of the semiconductor structure and improving the internal quantum efficiency. In some embodiments of the present disclosure, the transparent conductive layer may have an average thickness ranging from about 1 nm to about 1000 nm, thereby facilitating light emission of the LED.

Step S1000: the transparent conductive layer 900, the second semiconductor layer, the second semiconductor barrier layer 600 and the light emitting layer 500 may be partially etched to expose a part of the first semiconductor layer 400.

Step S1100: a first electrode 930 may be formed on the first semiconductor layer 400 and a second electrode 940 may be formed on the transparent conductive layer 900. In some embodiments, the first electrode 930 and the second electrode 940 may comprise a Ti/Au alloy. In some embodiments of the present disclosure, the first electrode 930 and the second electrode 940 may comprise an alloy comprising at least one metal chosen from Ni, Au, Al, Ti, Pd, Pt, Sn and Cr. In some embodiments of the present disclosure, the first electrode 930 and the second electrode 940 may have a thickness ranging from about 0.2 μm to about 1 μm. In some embodiments of the present disclosure, the first electrode 930 and the second electrode 940 may have a thickness of about 0.5 μm. In this way, the contact resistance between the electrodes and the LED may be reduced without affecting the light emitting efficiency of the LED.

With the LED prepared by the method according to some embodiments of the present disclosure, each of the comb teeth 920 may be formed right above each first groove 120, so that most of the current may pass through the part of the semiconductor structure with less crystal defects and little current may pass through the other part of the semiconductor structure with more crystal defects. Therefore, the probability of the nonradioactive recombination may be largely decreased, improving the internal quantum efficiency of the LED and improving the energy conversion rate, i.e., the electric energy utilization rate. Moreover, the LED may comprise the transparent conductive layer 900 and the plurality of rough structures 810, thereby improving the external quantum efficiency of the LED. Therefore, the light emitting efficiency of the LED may be improved.

Referring to FIG. 5, In some embodiments of the present disclosure, after the step S800, the method may further comprise: forming a plurality of insulator parts 960 on the plurality of rough structures 810 as shown in FIG. 5, wherein each insulator part 960 may be formed right above each first convex part 110. In some embodiments, the insulator parts 960 may comprise silica or silicon nitride. Then the transparent conductive layer 900 may be formed on the heavily doped p-type semiconductor layer 800 using the insulator parts 960 as a mask.

In some embodiments of the present disclosure, step S1000 may be replaced by removing the substrate 100, the nucleation layer 200 and the buffer layer 300 through gridding or laser stripping technology. Then the first electrode 930 may be formed below the first semiconductor layer 400. In the LED thus formed, the second electrode 940 may be formed right above the first electrode 930, so that the LED may have an improved light emitting efficiency.

Although explanatory embodiments have been shown and described, it would be appreciated by those skilled in the art that changes, alternatives, and modifications can be made in the embodiments without departing from spirit and principles of the disclosure. Such changes, alternatives, and modifications all fall into the scope of the claims and their equivalents.

What is claimed is:

1. A light emitting diode, comprising:
    a substrate comprising a plurality of first grooves and a plurality of first convex parts formed on a surface of the substrate, with the first groove formed between two neighboring first convex parts;
    a semiconductor structure formed on the surface of the substrate, said semiconductor structure comprising a plurality of second convex parts corresponding to the plurality of first grooves and a plurality of second grooves corresponding to the plurality of first convex parts;
    a comb-shaped transparent conductive layer formed on the semiconductor structure and configured to transmit a current to the plurality of second convex parts;
    a first electrode electrically connected with the semiconductor structure; and
    a second electrode electrically connected with the transparent conductive layer.

2. The light emitting diode of claim 1, wherein the transparent conductive layer comprises:
    a plurality of comb teeth, each of which is formed above each first groove; and
    a conductive comb frame connected with the plurality of comb teeth.

3. The light emitting diode of claim 2, wherein the comb tooth has a width not greater than the width of the first groove.

4. A light emitting diode, comprising:
    a substrate comprising a plurality of first grooves and a plurality of first convex parts formed on a surface of the substrate, with the first groove formed between two neighboring first convex parts;
    a semiconductor structure formed on the surface of the substrate, said semiconductor structure comprising a plurality of second convex parts corresponding to the plurality of first grooves and a plurality of second grooves corresponding to the plurality of first convex parts;
    a transparent conductive layer formed on the semiconductor structure and configured to transmit a current to the plurality of second convex parts;
    a first electrode electrically connected with the semiconductor structure; and
    a second electrode electrically connected with the transparent conductive layer; and
    a plurality of insulator parts, wherein each insulator part is formed above each first convex part.

5. The light emitting diode of claim 1, wherein the semiconductor structure comprises:
    a nucleation layer formed with the plurality of second convex parts and the plurality of second grooves;
    a buffer layer formed on the nucleation layer;
    a first semiconductor layer formed on the buffer layer;

a light emitting layer formed on the first semiconductor layer; and a second semiconductor layer formed on the light emitting layer.

6. The light emitting diode of claim 5, wherein the first electrode is electrically connected with the first semiconductor layer, and the second electrode is electrically connected with the transparent conductive layer.

7. The light emitting diode of claim 1, wherein the first groove has a width ranging from about 2 µm t about 8 µm and a depth ranging from about 1.5 µm to about 5 µm, and the first convex part has a width ranging from about 2 µm to about 10 µm.

8. The light emitting diode of claim 1, wherein the first convex part has a circular or polygonal cross section.

9. The light emitting diode of claim 1, further comprising a plurality of rough structures formed on the semiconductor structure, wherein each rough structures is formed above each first convex part.

10. The light emitting diode of claim 1, wherein the transparent conductive layer has a thickness ranging from about 1 nm to about 1000 nm.

\* \* \* \* \*